United States Patent
Kwok et al.

(10) Patent No.: US 8,819,599 B2
(45) Date of Patent: Aug. 26, 2014

(54) HIERARCHICAL VERIFICATION OF CLOCK DOMAIN CROSSINGS

(75) Inventors: Ka-Kei Kwok, Saratoga, CA (US); Priya Viswanathan, Santa Clara, CA (US); Rojer Raji Sabbagh, Ottawa (CA); Ramesh Sathianathan, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 89 days.

(21) Appl. No.: 12/615,184

(22) Filed: Nov. 9, 2009

(65) Prior Publication Data

US 2010/0242003 A1 Sep. 23, 2010

Related U.S. Application Data

(60) Provisional application No. 61/112,396, filed on Nov. 7, 2008.

(51) Int. Cl.
*G06F 17/50* (2006.01)

(52) U.S. Cl.
USPC ........................................ 716/6; 716/7; 716/8

(58) Field of Classification Search
USPC .................. 716/106–108, 111–113
See application file for complete search history.

(56) References Cited

U.S. PATENT DOCUMENTS

2008/0134115 A1* 6/2008 Ly et al. ............................ 716/5
2010/0146468 A1* 6/2010 Czeck et al. ...................... 716/6

* cited by examiner

*Primary Examiner* — Paul Dinh
(74) *Attorney, Agent, or Firm* — Plumsea Law Group, LLC

(57) ABSTRACT

The invention provides for the hierarchical verification of clock domain crossings. In various implementations of the invention, a device design is partitioned into blocks. Subsequently, a block level clock domain crossing verification process is performed on selected ones of the blocks. Verification interface files are generated by the block level clock domain crossing process. After which, a top level clock domain crossing verification process is performed over the entire design. In various implementations, the top level clock domain crossing verification process utilizes the verification interface files to verify clock domain crossing signals between blocks. Additionally, in some implementations, blocks not verified during block level verification are verified during top level verification. With some implementations of the invention, the device design is partitioned based input from a user of the implementation. Furthermore, in various implementations, the specific clock domain crossing verification checks employed during block level verification and top level verification are specified by a user of the implementation.

19 Claims, 6 Drawing Sheets

```
//Clock Information
    // set_cdc_clock    clk1
    // set_cdc_clock    clk2

//Port Information
    // set_cdc_port_domain    d1       -clock        clk1
    // set_cdc_port_domian    clk_out  -combo_path   clk1
    // set_cdc_port_domain    out      -clock        clk2    -combo_logic
```

HIERARCHICAL VERIFICATION OF CLOCK DOMAIN CROSSINGS

RELATED APPLICATIONS

This applications claims priority under 35 U.S.C. §119 to U.S. Provisional Patent Application No. 61/112,396, entitled "Hierarchical Verification Of Clock Domain Crossings," naming Ka-Kei Kwok et al. as inventors, and filed Nov. 7, 2009, which application is incorporated entirely herein by reference.

FIELD OF THE INVENTION

The invention relates to the field of electronic device design and verification. More specifically, various implementations of the invention relate to verification of clock domain crossings.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, often mathematically, to confirm that the circuit described by the device design will correctly perform the desired functions. This analysis is sometimes referred to as "formal verification." Additionally, timing verifications are often made at this stage, by for example simulating the various clocks employed to drive the device.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools) are commonly used for both of these tasks.

As indicated, device verification often takes place prior to the actual manufacturing of the device. As a result, hardware description languages are typically employed to model the hardware and act as an embodiment for testing purposes. However, testing and verification of physical devices also occurs after manufacturing. For purposes of brevity and clarity, a distinction between verification at the design level and at the physical level is not always made in the balance of this disclosure. Furthermore, the term device may be used interchangeably to refer to a physical embodiment of the device as well as to models or other representations of the device.

Clock Domain Crossing Verification

As stated, verification of the timing of a device often takes place during device development. The speed with which components in a circuit process signals is dictated or "driven" by a clock. Modern circuits may have multiple clocks. For example, a modern microprocessor may have a clock that allows for performance at maximum speed as well as a second clock that allows the device to perform at a reduced speed. Due to the flexibility of modern designs, multiple clocks are often required. The number of clocks in a given design is further increased by the fact that modern circuits are decreasing in size exponentially, which has allowed designers to add an increased number of circuit components into a design of a given size. This is especially true in the realm of System-on-Chip (SOC) devices.

A System-on-Chip is a microcircuit device that contains blocks or "systems" for performing various tasks, packaged as a single device. System-on-Chip devices are prevalent in modern electronics, such as cell-phones, digital video disk (DVD) players, video game consoles, household appliances, automobiles, and telecommunications equipment. Typically, a System-on-Chip is composed of blocks specifically designed to perform a particular task. These blocks are all interconnected by some communication structure, such as a shared communication bus or even a Network-on-Chip (NoC).

The components or blocks of a circuit are driven by a particular clock or a particular clock frequency. A clock having a particular frequency or speed is often referred to as a clock domain. More particularly, a clock domain is a circuit component or group of components driven by a clock or even a group of clocks that have a fixed phase relationship to each other. Clocks that are asynchronous to each other belong to different clock domains. Similarly, components driven by asynchronous clocks are said to belong to different clock domains.

Electronic signals may originate from one clock domains and be conveyed or transferred to a different clock domain, by for example signal sampling. A signal that originates in a different clock domain than it is received in, is said to be a clock domain crossing (CDC) signal. Designs where multiple clock domain crossings occur have historically been difficult for designers to verify. Traditionally, clock domain crossing verification techniques consisted of either verifying clock domain crossing signals during static timing analysis (STA) or by running gate-level simulations. Traditional clock domain crossing verification is discussed in detail in *The Anomalous Behavior of Flip-Flops in Synchronizer Circuits*, by W. Fleischhammer and O. Dortok, IEEE Transactions on Computers, Vol. 28, pp. 273-276, 1979, *Synthesis and Scripting Techniques for Designing Asynchronous Clock Designs*, by C. Cummings, SNUG, 2001, and *Fourteen Ways to Fool Your Synchronizers*, by R. Ginosar, ASYNC, 2003, which articles are incorporated entirely herein by reference.

As the number of clock domain crossing signals within a design grows (modern designs may contain or more clock domain crossing signals), traditional techniques are often insufficient to completely verify the clock domain crossings within a device design. Traditional techniques often fail to provide exhaustive coverage of clock domain crossing violations for designs of this magnitude. Furthermore, traditional techniques are dependant on the quality of the simulation vector provided by the verification engineer. Another drawback to traditional techniques is that clock domain crossing violations, often referred to as "bugs" in the design, are found at a late stage of verification and design development. Bugs are very costly to fix at this stage of the design, as designers must again perform all the steps necessary to generate and verify a gate-level netlist from a register transfer level netlist.

Some clock domain crossing techniques that go beyond static timing analysis and gate-level simulation have been proposed. These are discussed in *Using Assertion-Based Verification to Verify Clock Domain Crossing Signals*, by Chris Kwok et al, DVCon, 2003, *Verifying Synchronization in Multi-Clock Domain SoC*, by T. Kapschitz, DVCon, 2004, and *Designing a Safe Multi-Clock Chip with Clock Intent Verification*, by J. Littlefield, DVCon, 2004, which articles are incorporated entirely herein by reference. However, these techniques are still insufficient to perform exhaustive clock domain crossing verification. This is especially true for large designs, where the number of clock domain crossing signals is increasing exponentially in parallel with the increasing number of clock domains. Particularly troubling is the fact that multiple iterations of verification and error correction in the design flow are required to completely resolve all clock domain crossing violations.

SUMMARY OF THE INVENTION

The invention provides for the hierarchical verification of clock domain crossings. In various implementations of the invention, a device design is partitioned into blocks. Subsequently, a block level clock domain crossing verification process is performed on selected ones of the blocks. Verification interface files are generated by the block level clock domain crossing process. After which, a top level clock domain crossing verification process is performed over the entire design. In various implementations, the top level clock domain crossing verification process utilizes the verification interface files to verify clock domain crossing signals between blocks. Additionally, in some implementations, blocks not verified during block level verification are verified during top level verification. With some implementations of the invention, the device design is partitioned based input from a user of the implementation. Furthermore, in various implementations, the specific clock domain crossing verification checks employed during block level verification and top level verification are specified by a user of the implementation.

BRIEF DESCRIPTION OF THE DRAWINGS

The present invention will be described by way of illustrative embodiments shown in the accompanying drawings in which like references denote similar elements, and in which.

DETAILED DESCRIPTION OF ILLUSTRATIVE EMBODIMENTS

Although the operations of the disclosed implementations may be described herein in a particular sequential order, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods. Additionally, the detailed description sometimes uses terms like "determine" to describe the disclosed methods. Such terms are often high-level abstractions of the actual operations that are performed. The actual operations that correspond to these terms will vary depending on the particular implementation and are readily discernible by one of ordinary skill in the art.

Furthermore, in various implementations of the invention, a mathematical model may be employed to represent an electronic device. With some implementations, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, results in a different device design. More particularly, manipulation of the model results in a transformation of the corresponding physical design and any physical device rendered or manufactured by the device design. Additionally, those of skill in the art can appreciate that during many electronic design and verification processes, the response of a devices design to various signals or inputs is simulated. This simulated response corresponds to the actual physical response the device would have to these various signals or inputs.

Some of the methods described herein can be implemented by software stored on a computer readable storage medium, or executed on a computer. Additionally, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
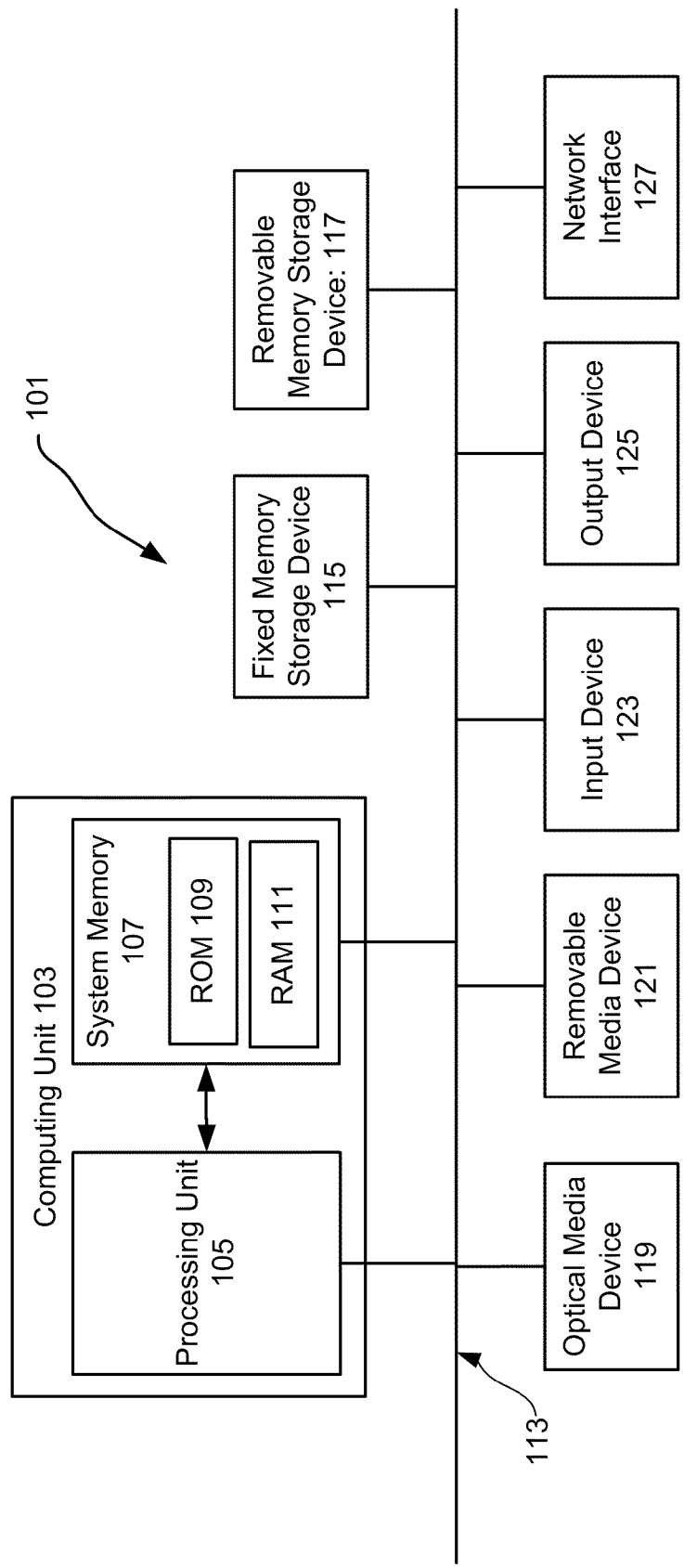
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices; such as a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Clock Domain Crossing Verification

As stated above, modern electronic designs typically have multiple asynchronous clocks, resulting in multiple clock domains and clock domain crossing signals. The most common problem associated with clock domain crossings is metastability. Metastability may result when a clock domain crossing signal violates a setup or hold time. More particularly, due to the clock domain crossing signal violating the setup or hold time, the output will "sit" at an intermediate voltage level and eventually settle on either the high or low voltage level randomly. Accordingly, verification of these different clock domain crossings is required to ensure that the design is free from problems, such as, for example, metastability associated with the clock domains crossings.

Five Part Clock Domain Crossing Verification Methodology

Figure 2:
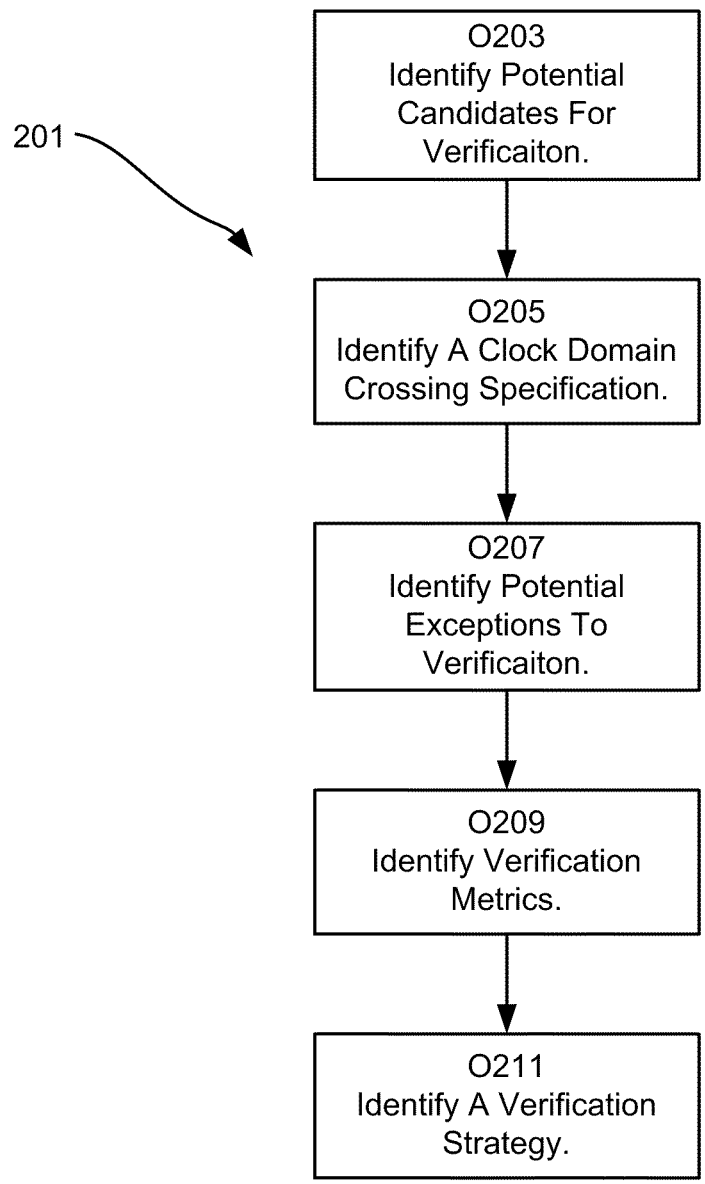
FIG. 2 illustrates a clock domain crossing verification methodology.

Some clock domain crossing verification processes follow a five step methodology. FIG. 2 illustrates a five step clock domain crossing verification methodology 201. As can be seen from this figure, the methodology 201 includes an operation 203 for identifying potential candidates for verification. In various implementations, the operation 203 identifies portions of an electronic device design that have multiple asynchronous clocks. With some implementations, the operation 203 identifies portions of an electronic device design designated for verification by a verification engineer. With some implementations, it is advantageous that the operation 203 be directed to identify portions of the electronic device design with which the verification engineer has a thorough understanding, as this may increase the exhaustiveness of the clock domain crossing verification process.

The method 201 additionally includes an operation 205 for identifying a clock domain crossing specification. The clock domain crossing specification details the operational modes of the clock domains, the structure of the clocks and the clock domains, the signals that interface between the different clock domains, and the clock domain synchronization rules. Additionally, a clock domain crossing specification may detail the legal and illegal clock domain crossing schemes. Typically, a clock domain crossing specification is written in a hardware description language, such as, for example, Verilog.

As can be seen, the method 201 further includes an operation 207 for identifying potential exceptions to verification. In various implementations, it is not necessary to verify some clock domain crossings, or some clock domain crossing signals. For example, clock domain crossing signals that are stable during the entire operation of the electronic device design often do not need synchronization. This is especially true for configuration registers, status registers, or software programmable registers. As a result, it may be desirable to not perform clock domain crossing verification on these signals.

An operation 209 for identifying verification metrics and an operation 211 for identifying a verification strategy are also included in the method 201. With some implementations, the operation 209 for identifying verification metrics identifies benchmarks that may be utilized to determine if the "goals" associated with the clock domain crossing verification process are achieved. Similarly, in some implementations, the operation 211 for identifying a verification strategy may identify a particular method of verification, such as, for example, block-level verification, top-level verification, bug hunt and triage, or targeted coverage verification.

Hierarchical Clock Domain Crossing Verification

Figure 3:
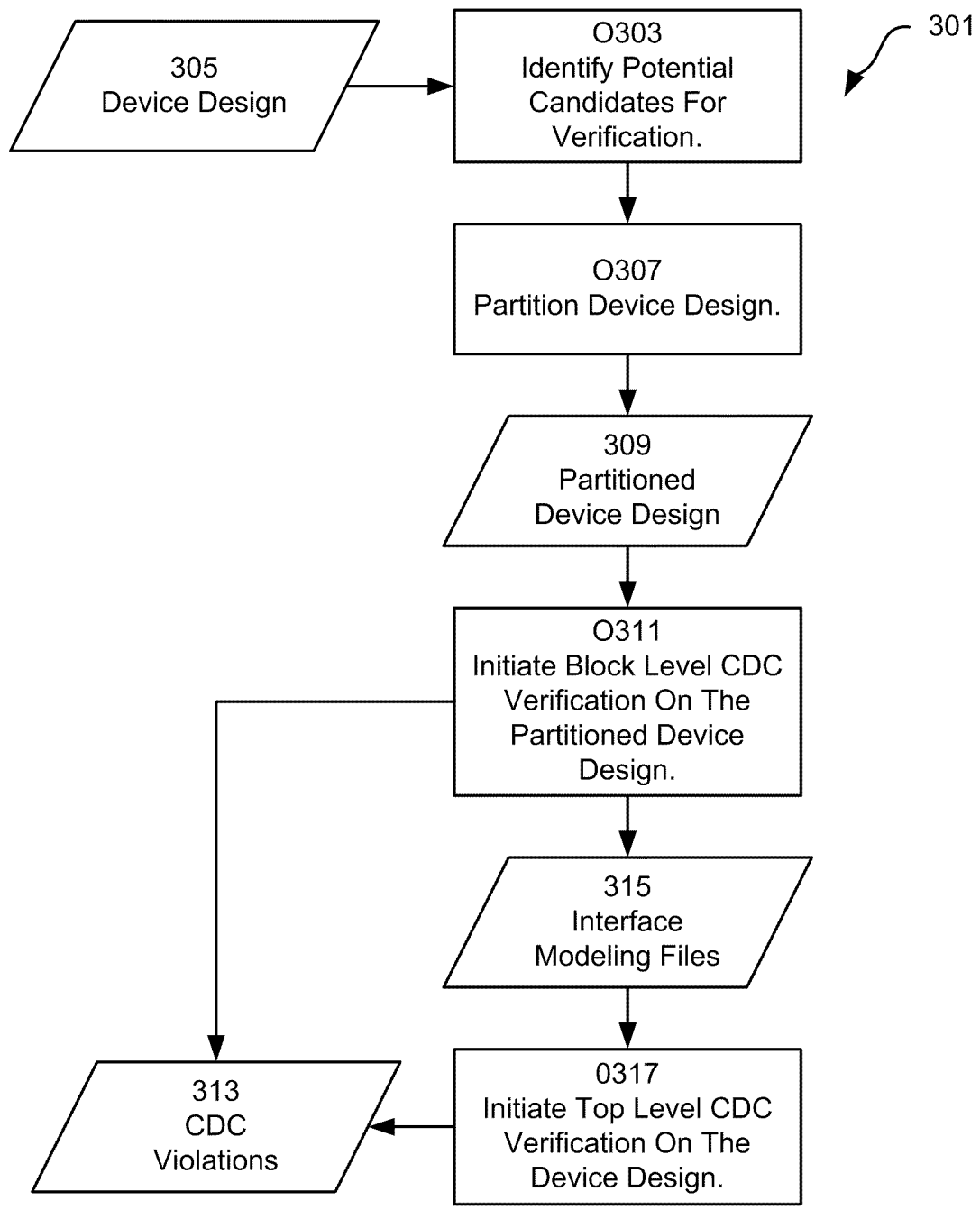
FIG. 3 illustrates a clock domain crossing verification method according to various implementations of the invention.

Various implementations of the invention incorporate the five step clock domain crossing verification methodology shown in FIG. 2 into a hierarchical verification method. FIG. 3 illustrates a hierarchical verification method that may be provided according to various implementations of the present invention. As can be seen from this figure, the method 301 includes the operation 303 for identifying portions of a device design 305 to verify. The operation 303, similar to the operation 203, may identify portions of the device design 305 that have been designated for verification by a verification engineer.

Figure 5:
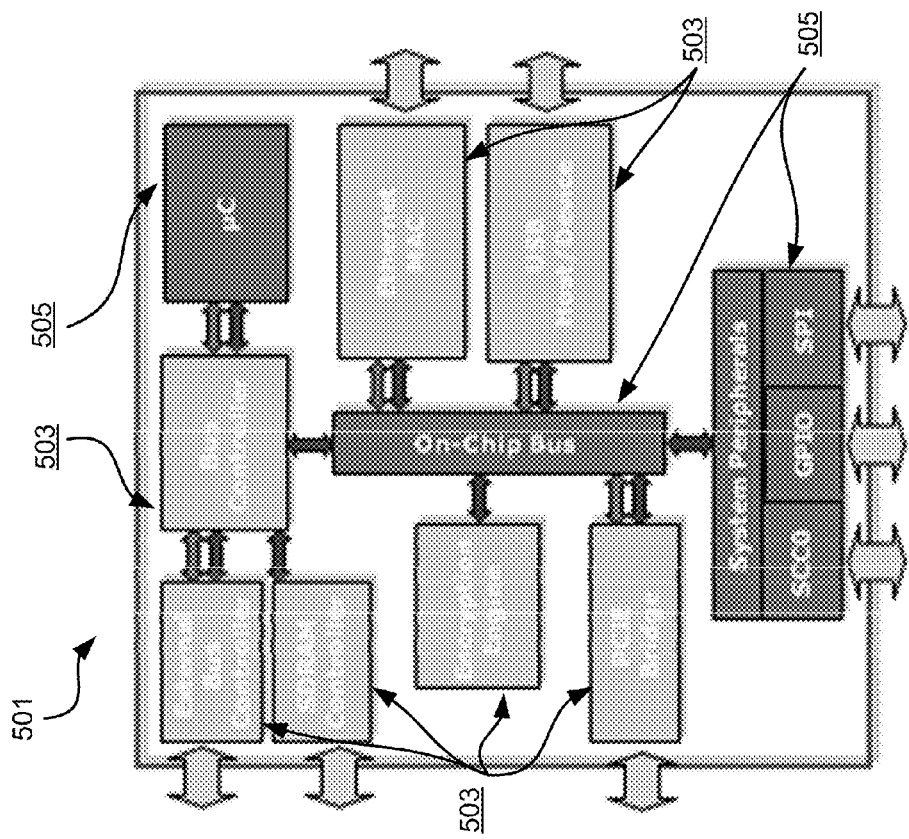
FIG. 5 illustrates the electronic device design of FIG. 4, shown in alternative detail.
Figure 4:
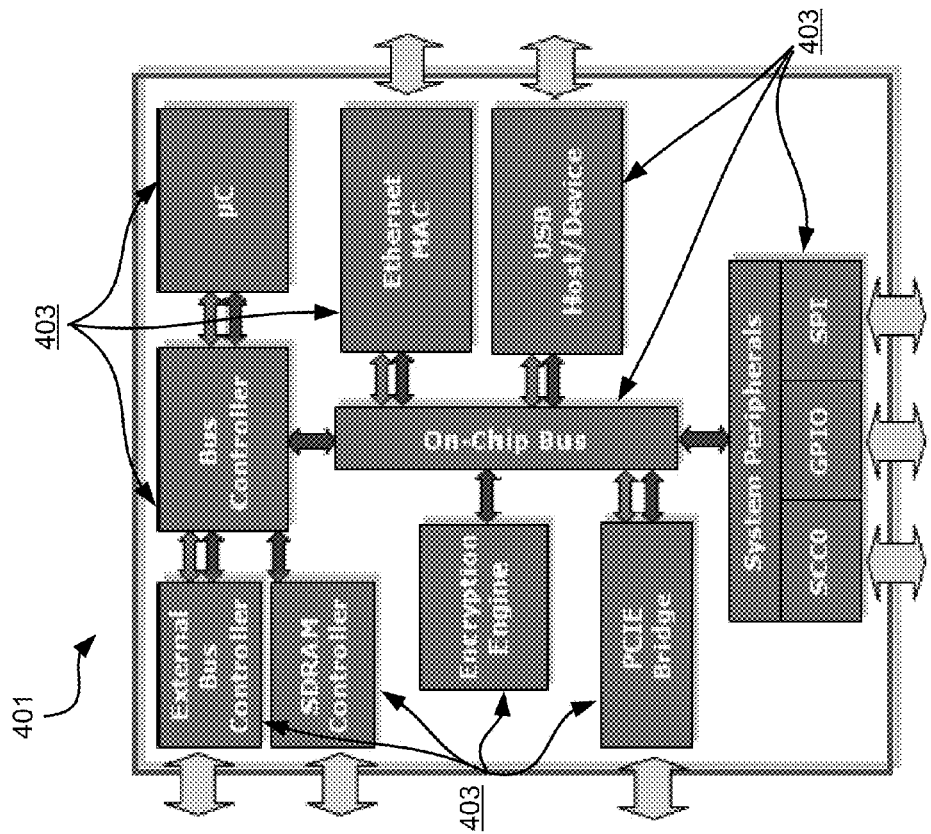
FIG. 4 illustrates an electronic device design.

The method 301 further includes an operation 307 for partitioning the device design 305. In various implementations of the invention, the operations 307 divides the portions of the device design 305 identified by the operation 303 into two groups, a block level group and a top level group, resulting in a partitioned device design 309. With some implementations, the partitioning is based upon designations made by a verification engineer. For example, FIG. 4 illustrates a device design 401. As can be seen from this figure, the device design 401 includes a plurality of portions 403. Often, these various portions are referred to as components or "blocks" or the device design 401. As detailed above, in various implementations, ones of the plurality of portions 403 are identified as candidates for verification, for example, by the operation 303. Subsequently, the device design 401 is partitioned into block level components and top level components, for example, by the operation 307. FIG. 5 illustrates a partitioned device design 501, which is the device design 401, having been partitioned into groups. As can be seen from this figure, the partitioned device design 501 includes the plurality of components 403. However, they are now grouped into block level components 503 and top level components 505.

Figure 6:
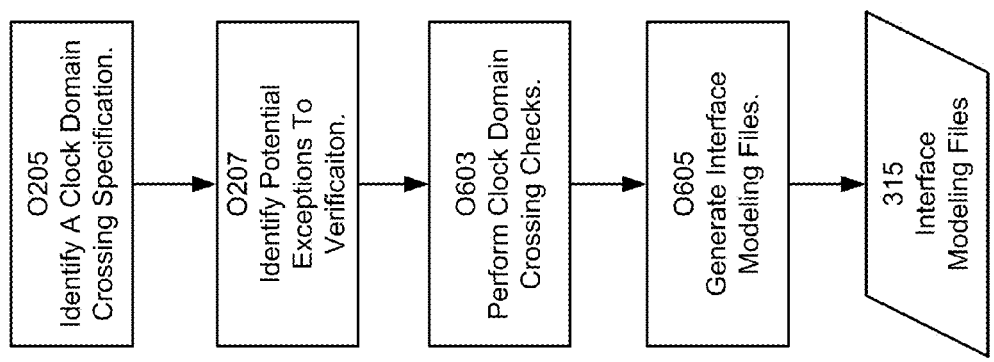
FIG. 6 illustrates a portion of the method shown in FIG. 3, in greater detail.

Returning to FIG. 3, the method 301 further includes an operation 311 for initiating a block level clock domain crossing verification process on the partitioned device design 309. As shown, one or more clock domain crossing violations 313 may be reported by the block level clock domain crossing verification process. Furthermore, as illustrated, a set of interface modeling files 315 are generated by the operation 311. In various implementations, the operation 311 causes a clock domain crossing verification process to be performed on the block level components 503. FIG. 6 illustrates a method 601 for initiating a block level clock domain crossing process. With some implementations, the operation 311 performs the method 601. As can be seen from FIG. 6, the method 601 includes the operation 205 for identifying a clock domain crossing specification and the operation 207 for identifying potential exceptions to clock domain crossing verification. As stated above, the operation 205 and the operation 207, respectively, identify the structure and operation of the clock domain crossings and any clock domain crossing signals that do need to be verified.

The method 601 also includes an operation 603 for causing clock domain crossing checks to be performed on the block level components, such as, for example, the components 503. In various implementations, a verification tool, such as, for example, the 0-In CDC tool, available from Mentor Graphics Corporation, of Wilsonville, OR, is utilized to perform the verification. With various implementations, a formal clock domain crossing verification process is carried out. For example, in some implementations, the operation 603 causes the verification process described in U.S. patent application Ser. No. 12/559,343, entitled "Formal Verification of Clock Domain Crossings, filed Sep. 14, 2009, and naming Ka-Kei Kwok et al. as inventors, which application is incorporated entirely herein by reference, to be carried out. Subsequently, the method 601 includes an operation 605 for generating the interface modeling files 315.

With some implementations, the operation 605 generates an interface modeling file for each of the block level components 503. Typically, the interface modeling files 315 are text files, which describe clock domain crossing information specific to each component block. For example, an interface modeling file may contain information specifying the clock domain for each port within the component block. In alternative implementations, the interface modeling files 315 are provided by a verification engineer. Accordingly, the interface modeling files 315 are instantiated prior to clock domain crossing verification, such as, for example, the verification caused to be performed by the operation 603. Subsequently, the operation 605 may modify the interface modeling files 315 based upon the verification. For example, if, during verification, it is detected that a particular port is connected to a synchronizer inside the component block, this information may be appended to the interface modeling file corresponding to the component block. Alternatively, if it is detected that synchronizer logic does not behave as a synchronizer, the synchronizer information may be removed from the interface modeling file.

Figure 7:
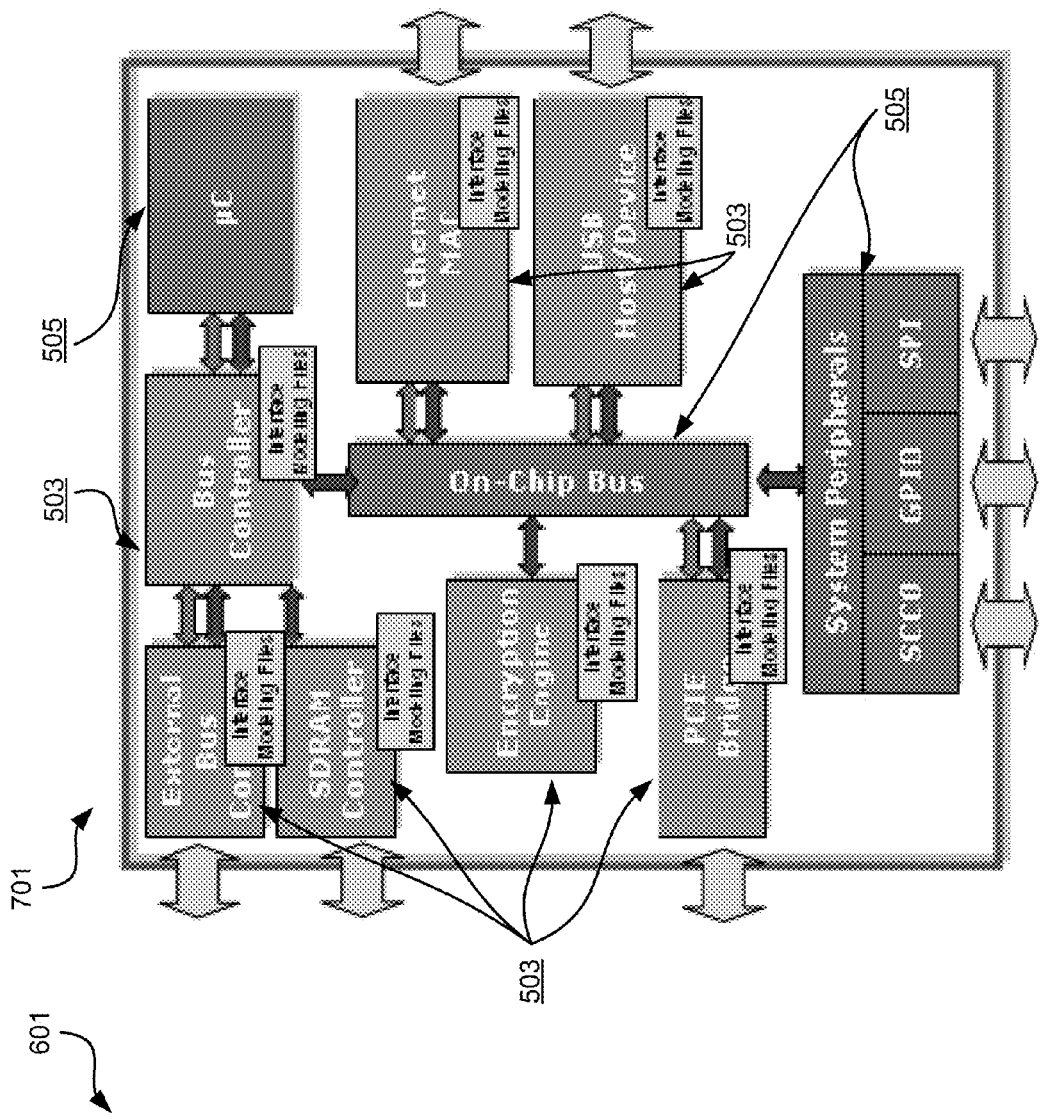
FIG. 7 illustrates the electronic device design of FIG. 4, shown in alternative detail.

Returning to FIG. 3, the method 301 also includes an operation 317 for initiating a top level clock domain crossing verification process on the device design 305. As can be seen from this figure, the operation 317 may also report clock domain crossing violations, which may be added to the set of clock domain crossing violations 313. In various implementations, the operation 317 causes a clock domain crossing verification process to be performed by a clock domain crossing tool, such as, for example, the 0-In CDC tool mentioned above. With various implementations, the operation 317 causes the clock domain crossing verification process to be performed on the entire device design 305. FIG. 7 illustrates a device design 701. As can be seen from this figure, the device design 701 corresponds to the device design 401 and 501. The block level components 503 and the top level components 505 are represented. As can be further seen, the block level components 503 are represented by their corresponding interface modeling files. Accordingly, the operation 317 causes the clock domain crossing verification process to be performed on the top level components 505 and utilizes the interface modeling files 315 to verify any clock domain crossings between the top level components 505 and the block level components 503.

Interface Modeling Files

Figures 8, 9:
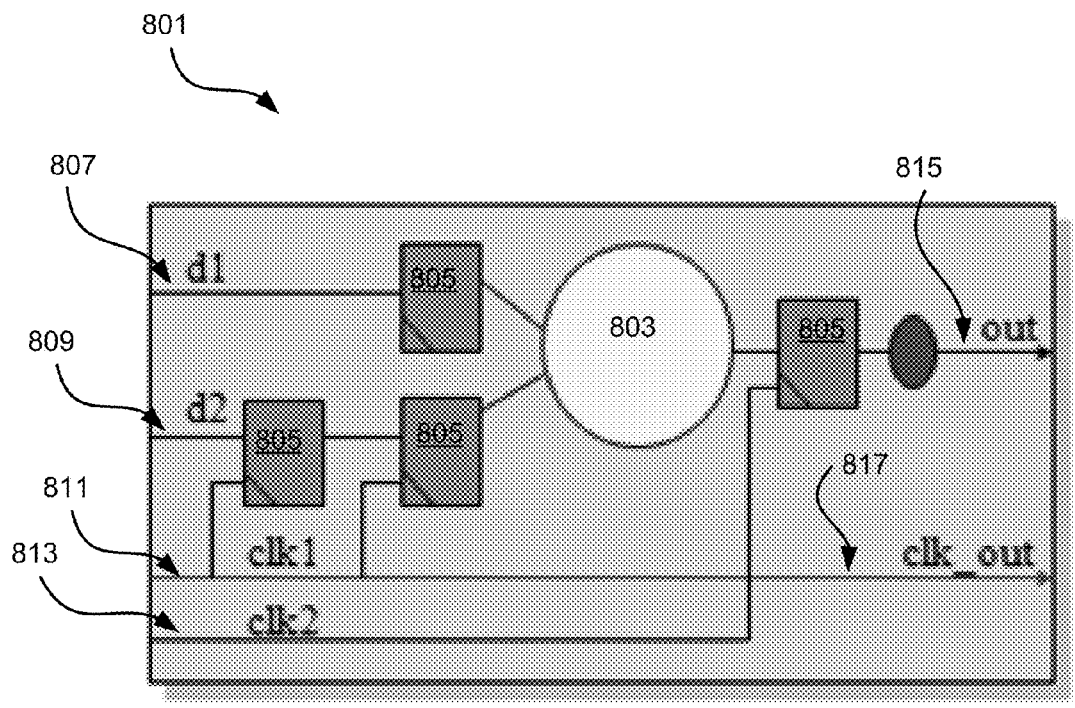
FIG. 8 illustrates a device design.
FIG. 9 illustrates an interface modeling file corresponding to the device design of FIG. 8 that may be utilized in various implementations of the present invention.

As described, various implementations of the invention utilize "interface modeling files" to carry out a hierarchical clock domain crossing verification process. Accordingly, various illustrative interface modeling files are described herein. FIG. 8 shows a device design 801. As can be seen from this figure, the device design 801 includes a multiplexer 803 and synchronizers 805. Furthermore, ports "d1" (i.e. 807) and "d2" (i.e. 809), clocks "clk1 (i.e. 811) and "clk2" (i.e. 813), and outputs "out" (i.e. 815) and "clk_out" (i.e. 817) are shown. FIG. 9 illustrates an interface modeling file 901, which may be generated by various implementations of the present invention, or which may be provided by a user of various implementations of the invention.

As can be seen from FIG. 9, clock information and port information corresponding to the device design 801 are defined. For example, the command "set_cdc_clock" may be used specify the clock ports for the device design 801. The command "set_cdc_port_domain" may be utilized to specify particular constraints on the various ports. For example, as can be seen in FIG. 9, the clock clk1 is specified as being the sampling (sometimes referred to as the driving) clock for the port d1, by the line "//set_cdc_port_domain d1-clock clk1" in the interface modeling file 901.

As detailed, the interface modeling files, such as the interface modeling file 901, are used to describe or define the characteristics of the component blocks 403. Illustrative constraints are detailed herein for brevity. However, although various implementations of the invention may utilize the detailed constraints, alternative implementations may not. Furthermore, implementations may be provided that include substitutions of the detailed constrains or include additions of other constraints not detailed herein.

One illustrative constraint is the "clock" constraint, which limits the sampling or driving clock for the port. Another illustrative constraint is the "same_clock" constraint, which limits two or more ports to be within the same clock domain. The same_clock constraint is typically used for a multiplexer synchronization scheme, where inputs are properly synchronized if they are in the same clock domain, but not all input may be properly synchronized if they are in different clock domains.

Another illustrative constraint is the "combo_logic" constraint. The presence of combinational logic between a register and a synchronizer can lead to bugs at the input of the synchronizer. These bugs might lead to metastability problems in the logic driven by the synchronizer. Accordingly, it may be beneficial to specify those blocks having combinatorial logic on the fan-in or fan-out ports.

A third illustrative constraint is the "combo_path" constraint. When an output port has a pure combinational path to an input port, the port domain of the output depends on the port domain of the input. In general, the output is a function of the input (to which it has a combinational path) and the driving registers. Accordingly, the port domain of the output often must be resolved based on the domains of the input and its other driving registers. If all the domains are the same, then the output gets the common domain; otherwise the output should be treated as asynchronous to all the domains, and all fan outs of this output need synchronization. The combo_path constraint may be used to specify that a purely combinational path exists from the input to an output.

This information may be leveraged by various implementations of the invention in two ways. First, if the input port is connected to a clock, the combo_path constraint may be used to continue the clock propagation from the output to which it has a purely combinational path. Second, clock domains of the output port may be resolved by the combo_path constraint. For example, a port that has a combinational path to an input port with only one driver is within the same domain as the driver. However, an output that has a combinational path to an input port that is driven by two registers having different clock domains may be inferred to be asynchronous, flagged with the combo_path constraint, and as a result, all clock domain crossings originating from the output port may be treated as violations.

Another illustrative constraint is the "nosync" constraint. Nosync may be used on an input port, which is sampled by different clocks.

Conclusion

As detailed above, the invention provides method and apparatuses for the hierarchical verification of clock domain crossings. In various implementations of the invention, a device design is partitioned into blocks. Subsequently, a block level clock domain crossing verification process is performed on selected ones of the blocks. Verification interface files are generated by the block level clock domain crossing process. After which, a top level clock domain crossing verification process is performed over the entire design. In various implementations, the top level clock domain crossing verification process utilizes the verification interface files to verify clock domain crossing signals between blocks. Additionally, in some implementations, blocks not verified during block level verification are verified during top level verification. With some implementations of the invention, the device design is partitioned based input from a user of the implementation.

What is claimed is:

1. A method for performing hierarchical verification of a device design comprising:
   accessing a device design having a plurality of hardware blocks;
   designating hardware blocks of the plurality of hardware blocks having more than one clock domain for a clock domain crossing verification;
   forming a block-level group from designated hardware blocks;
   employing a the computer to perform a block-level clock domain crossing verification process on the block-level group, the block-level clock domain crossing verification process generating a plurality of block-level interface models;
   employing the computer to perform a top-level clock domain crossing verification process to be performed on the device design based in part upon the block-level interface models; and
   saving results of the top-level clock domain crossing verification process to a memory storage location.

2. The method of claim 1, wherein: (a) the designated hardware blocks of the plurality of hardware blocks are divided into a first plurality of designated hardware blocks and a second plurality of designated hardware blocks, (b) the block-level group is formed from the first plurality of designated hardware blocks, and (c) forming the block-level group includes forming a top-level group from the second plurality of designated hardware blocks.

3. The method of claim 1, wherein employing the computer to perform a block-level clock domain crossing verification process includes performing a clock domain crossing verification process on each hardware block of the block-level group.

4. The method of claim 1, further comprising saving results of the block-level clock domain crossing verification process to a memory storage location.

5. The method of claim 1, further comprising saving each of the plurality of block-level interface models to a memory storage location as a block-level interface modeling file.

6. The method of claim 1, wherein one or more of the plurality of block-level interface models specifies a plurality of clock ports.

7. The method of claim 1, wherein one or more of the plurality of block-level interface models specifies a plurality of ports that are within the same clock domain.

8. The method of claim 1, wherein one or more of the plurality of block-level interface models specifies an output port having a pure combinational path to an input port.

9. The method of claim 1, wherein one or more of the plurality of block-level interface models specifies at least one of: (a) an input port having combinational logic on its fan-out, and (b) an output port having combinational logic on its fan-in.

10. The method of claim 1, wherein one or more of the plurality of block-level interface models specifies a sampling clock for an input port.

11. A method for performing hierarchical clock domain crossing verification using a computer system, the method comprising:
   using the computer system to access a device design having block-level group of design blocks and a top-level group of design blocks, each of the block-level group and the top-level group including a plurality of asynchronous clocks;
   initiating a first clock domain crossing verification process for one or more design blocks of the block-level group to generate interface modeling information;
   initiating a second clock domain crossing verification process for the top-level group utilizing the interface modeling information to verify one or more clock domain crossings between the block-level group and the top-level group; and
   reporting one or more clock domain crossing violations.

12. The method of claim 11, wherein initiating the first clock domain crossing verification process includes initiating a clock domain crossing verification process for each design block of the block-level group.

13. The method of claim 11, further comprising saving the interface modeling information to a memory storage location as one or more interface modeling files.

14. The method of claim 11, further comprising modifying one or more interface modeling files to include the interface modeling information.

15. The method of claim 11, further comprising saving, to a memory storage location, the results of at least one of: (a) the first clock domain crossing verification process initiated for the one or more design blocks of the block-level group, and (b) the second clock domain crossing verification process initiated for the top-level group.

16. A method for performing hierarchical clock domain crossing verification using a computer system, the method comprising:
   using the computer system to access a device design having a top-level, a plurality of design blocks, and a plurality of asynchronous clocks;
   dividing the device design into a partitioned device design having a block-level group including one or more first design blocks of the plurality of design blocks and a top-level group including one or more second design blocks of the plurality of design blocks;
   performing a first clock domain crossing verification process on each design block of the one or more first design blocks to generate interface modeling information corresponding with each design block;
   performing a second clock domain crossing verification process on the top-level, each of the first design blocks being represented by the corresponding interface modeling information; and
   reporting one or more clock domain crossing violations.

17. The method of claim 16, further comprising saving the interface modeling information to a memory storage location as one or more interface modeling files.

18. The method of claim 16, further comprising modifying one or more interface modeling files to include the interface modeling information.

19. The method of claim 16, further comprising saving, to a memory storage location, the results of at least one of: (a) performing the first clock domain crossing verification process on each design block of the one or more first design blocks, and (b) performing the second clock domain crossing verification process on the top-level.

* * * * *